United States Patent
Yaegashi

(10) Patent No.: US 9,679,770 B2
(45) Date of Patent: Jun. 13, 2017

(54) SEMICONDUCTOR DEVICE MANUFACTURING METHOD AND SEMICONDUCTOR DEVICE MANUFACTURING APPARATUS

(71) Applicant: TOKYO ELECTRON LIMITED, Tokyo (JP)

(72) Inventor: Hidetami Yaegashi, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/619,616

(22) Filed: Feb. 11, 2015

(65) Prior Publication Data

US 2015/0235850 A1    Aug. 20, 2015

(30) Foreign Application Priority Data

Feb. 20, 2014    (JP)    ................. 2014-030238

(51) Int. Cl.

| C03C 15/00 | (2006.01) |
|---|---|
| C03C 25/68 | (2006.01) |
| C23F 1/00 | (2006.01) |
| B44C 1/22 | (2006.01) |
| H01L 21/033 | (2006.01) |
| H01L 21/67 | (2006.01) |

(52) U.S. Cl.
CPC .... *H01L 21/0337* (2013.01); *H01L 21/67178* (2013.01)

(58) Field of Classification Search
CPC .............................. C23C 16/46; H01L 21/0337
See application file for complete search history.

(56) References Cited

U.S. PATENT DOCUMENTS

| 5,271,972 | A | * | 12/1993 | Kwok | ................... | C23C 16/402 |
|---|---|---|---|---|---|---|
| | | | | | | 257/E21.279 |
| 6,040,118 | A | * | 3/2000 | Capodieci | ............. | G03F 7/2022 |
| | | | | | | 430/328 |
| 8,852,851 | B2 | * | 10/2014 | Zhou | ................... | H01L 21/0337 |
| | | | | | | 430/311 |
| 2006/0276043 | A1 | * | 12/2006 | Johnson | ................. | B82Y 10/00 |
| | | | | | | 438/717 |
| 2009/0011365 | A1 | * | 1/2009 | Kobayashi | ............ | G03F 7/0046 |
| | | | | | | 430/284.1 |
| 2015/0031207 | A1 | * | 1/2015 | Bencher | .............. | H01L 21/0337 |
| | | | | | | 438/696 |

FOREIGN PATENT DOCUMENTS

| JP | 2006-229184 A | 8/2006 |
|---|---|---|
| JP | 2009-88085 A | 4/2009 |
| JP | 2011-27890 A | 2/2011 |
| JP | 2011-27980 A | 2/2011 |
| JP | 2011-238673 A | 11/2011 |
| WO | 2013/051383 A1 | 4/2013 |

* cited by examiner

*Primary Examiner* — Thomas Pham
(74) *Attorney, Agent, or Firm* — Rothwell, Figg, Ernst & Manbeck, P.C.

(57) ABSTRACT

A semiconductor device manufacturing method of the present invention includes forming a base film having a water-repellent surface on a substrate; forming a photosensitive film having a water-repellent surface on the base film; developing the photosensitive film to expose the base film, thereby forming a photosensitive film pattern; supplying a first spacer material on the photosensitive film and on the exposed base film; and removing at least a part of the first spacer material formed on a top surface of the photosensitive film and a top surface of the base film.

9 Claims, 17 Drawing Sheets

SEMICONDUCTOR DEVICE MANUFACTURING METHOD AND SEMICONDUCTOR DEVICE MANUFACTURING APPARATUS

CROSS-REFERENCE TO RELATED APPLICATIONS

This application is based on and claims priority from Japanese Patent Application No. 2014-030238, filed on Feb. 20, 2014 with the Japan Patent Office, the disclosure of which is incorporated herein in its entirety by reference.

TECHNICAL FIELD

The present disclosure relates to a semiconductor device method manufacturing method and a semiconductor device manufacturing apparatus.

BACKGROUND

With high integration of semiconductor devices, a process technique of more finely processing semiconductor devices is requested. As a technique of finely processing semiconductor devices, a pattern forming method has been known, in which a resistor pattern is formed using a photolithographic technique and the formed resist pattern is used as an etching mask to etch a workpiece.

It has been recently requested that semiconductor devices be miniaturized to a resolution limit or smaller of an exposing apparatus in the photolithographic technique.

As a technique of forming a pattern finer than the resolution limit of the exposing apparatus in the photolithographic technique, a patterning technique such as a side wall transfer (SWT) method is known (see, e.g., Japanese Laid-Open Patent Publication No. 2009-088085).

In the SWT method, an organic film is patterned by the photolithographic technique, for example, using an exposing apparatus and a coating and developing apparatus connected in line to the exposing apparatus. Further, a spacer material such as a silicon dioxide ($SiO_2$) film is formed conformally on the patterned organic film using a film forming apparatus such as a chemical vapor deposition (CVD) apparatus or an atomic layer deposition (ALD) apparatus. Subsequently, a part of the spacer material is etched using an etching device capable of performing an anisotropic etching such as a plasma etching apparatus, so that the spacer material remains only in a side wall portion of the pattern of the organic film. Then, the pattern of the organic film is removed and a desired fine pattern is formed by the spacer material.

SUMMARY

According to an aspect, the present disclosure provides a semiconductor device manufacturing method including: forming a base film having a water-repellent surface on a substrate; forming a photosensitive film having a water-repellent surface on the base film; developing the photosensitive film to expose the base film, thereby forming a photosensitive film pattern; supplying a first spacer material on the photosensitive film and on the exposed base film; and removing at least a part of the first spacer material formed on a top surface of the photosensitive film and a top surface of the base film.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
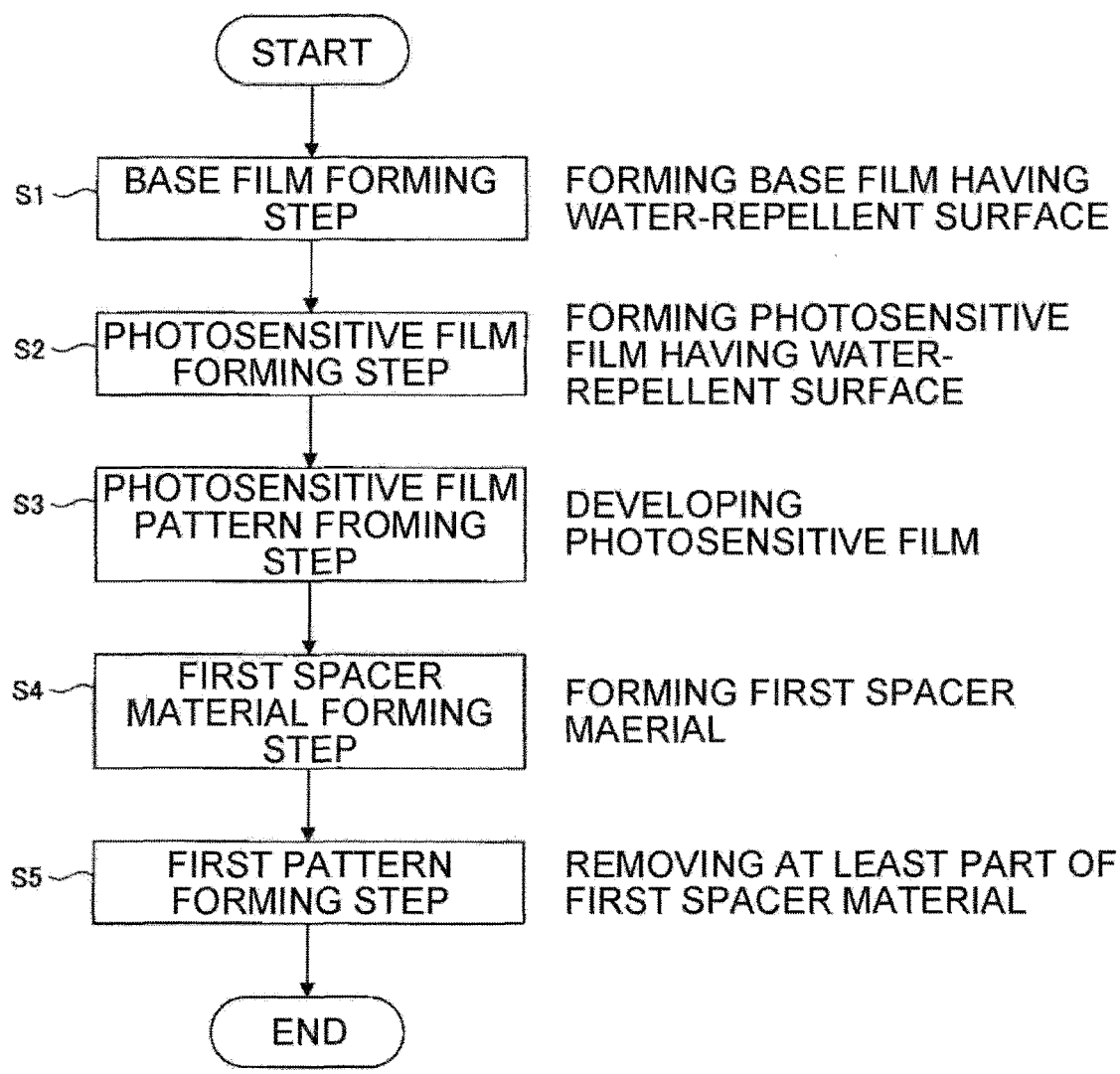
FIG. 1 is a flowchart illustrating an exemplary semiconductor device manufacturing method according to a first exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

In a patterning technique by the SWT method as described in Japanese Patent Laid-Open Publication No. 2009-088085, many kinds of semiconductor device manufacturing apparatus are used. Therefore, the process of manufacturing a semiconductor device having a desired fine pattern becomes complicated.

Accordingly, an object of the present disclosure is to provide a semiconductor device manufacturing method capable of easily manufacturing a semiconductor device having a desired fine pattern.

According to an aspect of the present disclosure, a semiconductor device manufacturing method includes forming a base film having a water-repellent surface on a substrate; forming a photosensitive film having a water-repellent surface on the base film; developing the photosensitive film to expose the base film, thereby forming a photosensitive film pattern; supplying a first spacer material on the photosensitive film and on the exposed base film; and removing at least a part of the first spacer material formed on a top surface of the photosensitive film and a top surface of the base film.

In the above-mentioned method, the base film includes an antireflective film, and the forming of the base film includes supplying a water-repellent material to the antireflective film after the antireflective film is formed.

In the above-mentioned method, the base film includes an antireflective film, and the forming of the base film includes spin-coating a coating liquid containing a water-repellent material to form the antireflective film.

In the above-mentioned method, the forming of the photosensitive film includes supplying a water-repellent material to the photosensitive film after the photosensitive film is formed.

In the above-mentioned method, the forming of the photosensitive film includes spin-coating a coating liquid containing a water-repellent material to form the photosensitive film.

In the above-mentioned method, the supplying of the first spacer material includes heating the substrate supplied with the first spacer material.

The above-mentioned method further includes, after the removing of at least a part of the first spacer material, supplying a second spacer material onto the substrate; and removing at least a part of the second spacer material formed on the top surface of the photosensitive film and the top surface of the base film.

The above-mentioned method further includes, after the removing of at least a part of the first spacer material, removing the photosensitive film pattern; supplying a second spacer material onto the substrate; and etching back the second spacer material such that the first spacer material is exposed.

The above-mentioned method further includes, after the removing at least a part of the second spacer material, removing the first spacer material.

According to another aspect of the present disclosure, a semiconductor device manufacturing apparatus includes: an antireflective film forming unit configured to form an antireflective film on a substrate; a photosensitive film forming unit configured to form a photosensitive film on the substrate; a water-repellency treatment unit configured to perform a water-repellency treatment on the antireflective film or the photosensitive film formed on the substrate; a developing unit configured to supply a developer to the substrate to develop the exposed photosensitive film; a spacer material forming unit configured to supply a spacer material to the substrate; a cleaning unit configured to supply a cleaning liquid to the substrate; a conveying mechanism configured to carry in and out the substrate among the antireflective film forming unit, the photosensitive film forming unit, the water-repellency treatment unit, the developing unit, the spacer material forming unit, and the cleaning unit; and a control unit configured to control the conveying mechanism and the cleaning unit such that the substrate carried out of the spacer material forming unit is conveyed to the cleaning unit and the spacer material supplied from the spacer material forming unit is removed in the cleaning unit.

In the above-mentioned apparatus, the spacer forming unit and the cleaning unit are the same unit.

The above-mentioned apparatus further includes a heating unit configured to heat the substrate. The control unit controls the conveying mechanism such that the substrate carried out of the spacer material forming unit is conveyed to the heating unit, and then, conveyed to the cleaning unit.

According to an aspect, a semiconductor device manufacturing method capable of easily manufacturing a semiconductor device having a desired fine pattern may be provided.

Hereinafter, exemplary embodiments of the present disclosure will be described with reference to the accompanying drawings. Meanwhile, in the specification and the drawings of the present disclosure, components having the substantially same functional configuration will be denoted by the same reference numerals and redundant descriptions thereof will be omitted.

[First Exemplary Embodiment]

First, a semiconductor device manufacturing method according to a first exemplary embodiment of the present disclosure will be described. FIG. 1 illustrates a flowchart of an exemplary semiconductor device manufacturing method according to the first exemplary embodiment.

The semiconductor device manufacturing method according to the first exemplary embodiment includes a base film forming step S1 of forming a base film having a water-repellent surface on a substrate, a photosensitive film forming step S2 of forming a photosensitive film having a water-repellent surface on the base film, a photosensitive film pattern forming step S3 of developing the photosensitive film to expose the base film, thereby forming a photosensitive film pattern, a first spacer material forming step S4 of supplying a first spacer material on the photosensitive film and on the exposed base film, and a first pattern forming step S5 of removing at least a part of the first spacer material formed on a top surface of the photosensitive film and a top surface of the base film.

Hereinafter, the respective steps will be described in detain with reference to FIGS. 2A to 2D, 3A to 3D, and 4A to 4D. FIGS. 2A to 2D, 3A to 3D, and 4A to 4D illustrate the exemplary semiconductor device manufacturing method according to the first exemplary embodiment.

(Base Film Forming Step S1)

Figure 2A:
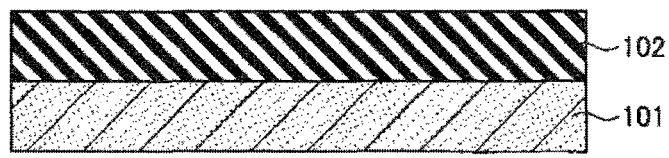
FIGS. 2A to 2D are cross-sectional views illustrating steps of an exemplary semiconductor device manufacturing method according to the first exemplary embodiment.

As illustrated in FIG. 2A, a base film 102 is formed on a substrate 101.

As the base film 102, an antireflective film such as, for example, a silicon-containing antireflective coating (SiARC), a bottom antireflective coating (BARC), a spin-on carbon (SOC), or amorphous carbon, may be used. As a method of forming the base film 102, spin coating may be preferably used because a uniform film is easily formed.

Figure 2B:
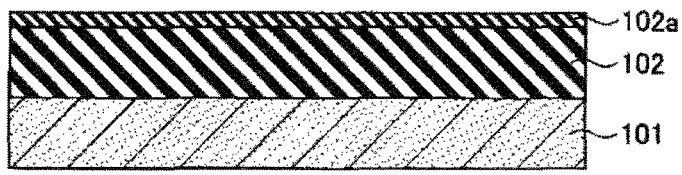

As illustrated in FIG. 2B, a water-repellent layer 102a is formed by performing a water-repellency treatment on the surface of the base film 102.

The water-repellency treatment is implemented by supplying a water-repellent material to the surface of the base film 102. As the water-repellent material, a surfactant containing a fluoroalkyl group, or a silane coupling agent, for example, may be suitably used. As a method of supplying the water-repellent material, a vapor-phase supply method or a liquid-phase supply method, for example, may be used.

(Photosensitive Film Forming Step S2)

Figure 2C:
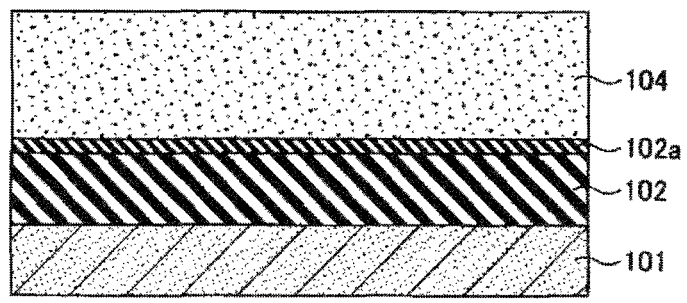

As illustrated in FIG. 2C, a photosensitive film 104 is formed on the water-repellent layer 102a.

The photosensitive film 104 is preferably incompatible with the water-repellent layer 102a and a water-repellent layer 104a (to be described later). As a method of forming the photosensitive film 104, a method of spin-coating a photosensitizing agent may be preferably used because a uniform film is easily formed.

Figure 2D:
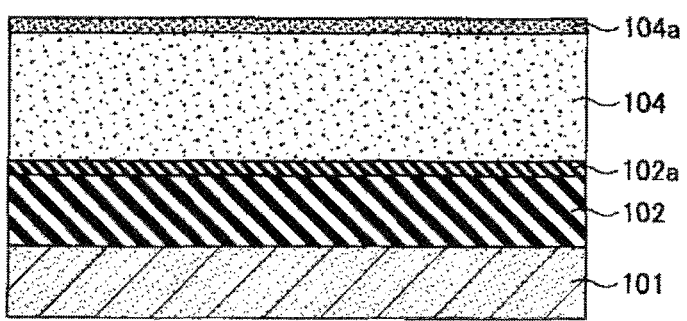

As illustrated in FIG. 2D, a water-repellent layer 104a is formed by performing a water-repellency treatment on the surface of the photosensitive film 104.

The water-repellency treatment is implemented by supplying a water-repellent material to the surface of the base film 102. As the water-repellent material, a surfactant containing a fluoroalkyl group, or a silane coupling agent, for example, may be suitably used. As a method of supplying the water-repellent material, a vapor-phase supply method or a liquid-phase supply method, for example, may be used.

Meanwhile, before the photosensitive film forming step S2, the surface of the substrate having the base film 102 thereon may be cleaned and subjected to baking (pre-coating baking) in order to improve adhesion of the photosensitive film 104 to the base film 102. The temperature of the pre-coating baking is preferably, for example, 100° C. to 150° C.

Further, after the photosensitive film forming step S2, baking (pre-exposure baking) may be performed to vaporize a solvent remaining in the photosensitive film 104 and densify the film at the same time. The temperature of the pre-exposure baking is preferably, for example, 100° C. to 150° C.

(Photosensitive Film Pattern Forming Step S3)

Figure 3A:
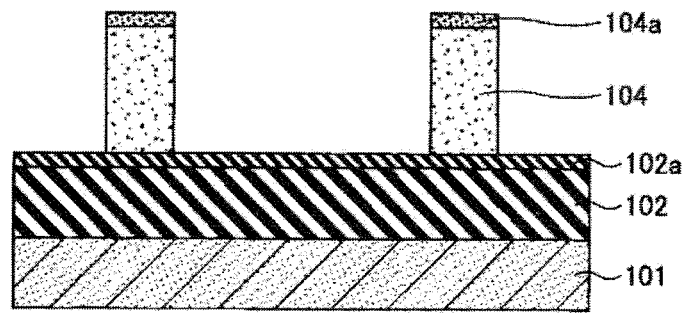
FIGS. 3A to 3D are cross-sectional views illustrating steps of the exemplary semiconductor device manufacturing method according to the first exemplary embodiment.

As illustrated in FIG. 3A, a photosensitive film pattern is formed by performing an exposure processing and a development processing on the photosensitive film 104. At this time, a part of the water-repellent layer 102a formed on the base film 102 is exposed.

The exposure processing is, for example, a processing of exposing the photosensitive film 104 using an exposure mask having a predetermined pattern to transfer the pattern of the exposure mask to the photosensitive film 104. An ultraviolet light source may be appropriately used as a light source for exposure. For example, ArF excimer laser having a wavelength of 193 nm may be used. After the exposure processing, baking (post-exposure baking) may be performed. The temperature of the post-exposure baking is preferably, for example, 100° C. to 150° C.

The development processing is, for example, a processing of supplying a developer onto the exposed photosensitive film 104 to form the pattern transferred by the exposure processing. After the development processing, a rinse processing may be performed using, for example, deionized water.

(First Spacer Material Forming Step S4)

Figure 3B:
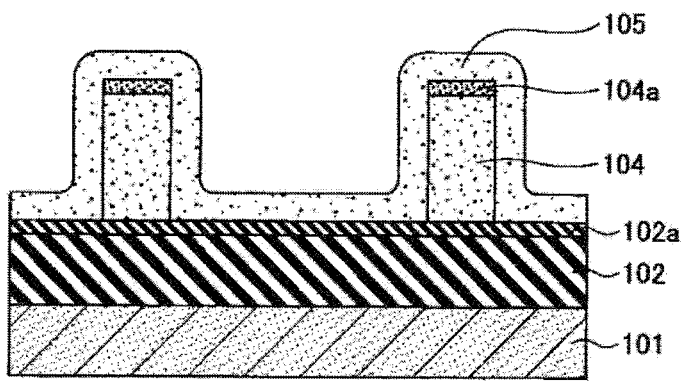

As illustrated in FIG. 3B, a first spacer material 105 is supplied onto the pattern-formed photosensitive film 104 and the exposed base film 102.

As a material of the first spacer material 105, an organometallic compound in which a chelate, acylate-based, or alkoxide-based organic compound is bound to a predetermined metal, or a silane coupling agent containing a predetermined metal, for example, may be appropriately used. The predetermined metal may be, for example, titanium (Ti), zirconium (Zr), tungsten (W), aluminum (Al), silicon (Si), or hafnium (Hf).

As a method of forming the first spacer material 105, a method excellent in step coverage is desirable. For example, a vapor-phase deposition, or a liquid-phase deposition such as spin coating may be used. Accordingly, the pattern may be formed with high accuracy.

Figure 3C:
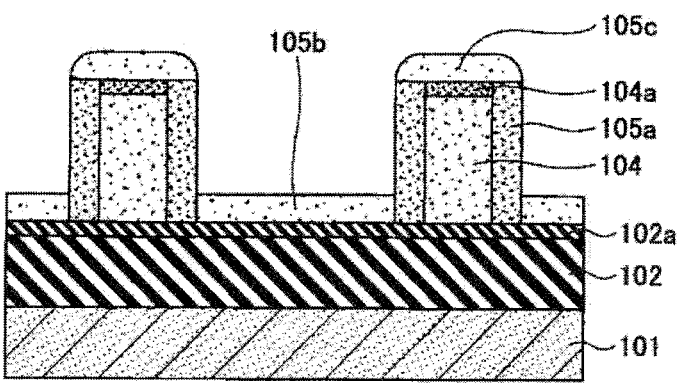

As illustrated in FIG. 3C, the substrate 101 supplied with the first spacer material 105 is dried. At this time, a first spacer material 105b formed on the top surface of the base film 102, which has the water-repellent layer 102a, hardly reacts with the base film 102 and does not undergo solidification. Further, a first spacer material 105c formed on the top surface of the photosensitive film 104, which has the water-repellent layer 104a, hardly reacts with the photosensitive film 104 and does not undergo solidification. Meanwhile, a first spacer material 105a formed on the side wall of the photosensitive film 104, which does not have the water-repellent layer 102a and the water-repellent layer 104a, reacts with the photosensitive film 104 and undergoes solidification.

A method of drying the substrate 101 is not particularly limited. However, from the viewpoint of facilitating solidification of the first spacer material 105a formed on the side wall of the photosensitive film 104 and stabilizing it, the method preferably includes a heating step of performing a heating processing. The temperature of the heating processing may be below a heat-resistant temperature of the photosensitive film 104, for example, 100° C. to 150° C.

(First Pattern Forming Step S5)

Figure 3D:
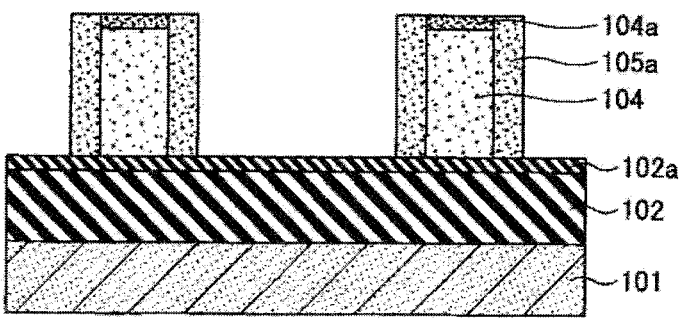

As illustrated in FIG. 3D, the substrate 101 is cleaned with an organic solvent. Accordingly, in the first spacer material 105, a portion which does not undergo solidification is removed, and a solidified portion is not removed but remains. That is, the first spacer material 105b formed on the top surface of the water-repellent layer 102a and the first spacer material 105c formed on the top surface of the water-repellent layer 104a are removed. On the other hand, the first spacer material 105a formed on the side wall of the photosensitive film 104 is substantially not removed but remains. As a result, a first pattern is formed by the first spacer material 105a formed at both sides of the side wall of the photosensitive film 104. Therefore, a pitch of the first pattern may be smaller than the pitch of the photosensitive film pattern. As a result, a pattern of an antireflective film having a pitch of a resolution limit or smaller of an exposure device may be formed by etching the base film 102 using the first pattern as an exposure mask.

(Photosensitive Film Removing Step)

Figure 4A:
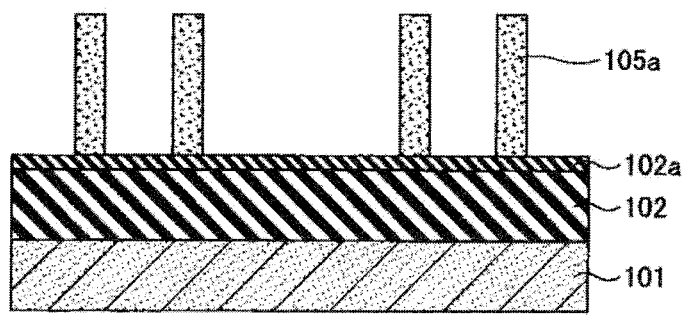
FIGS. 4A and 4B are cross-sectional views illustrating steps of the exemplary semiconductor device manufacturing method according to the first exemplary embodiment.

As illustrated in FIG. 4A, the photosensitive film 104 is etched by a dry etching method or a wet etching method. Accordingly, the photosensitive film 104 is selectively etched and removed. Meanwhile, the removal of the photosensitive film 104 may be performed simultaneously with the removal of the first spacer material 105b and the first spacer material 105c in the first pattern forming step S5. The method of performing the removal of the photosensitive film 104 simultaneously with the removal of the first spacer material 105b and the first spacer material 105c may be exemplified with a method of performing a spin-on processing with an aqueous hydrofluoric acid solution.

(Base Film Etching Step)

Figure 4B:
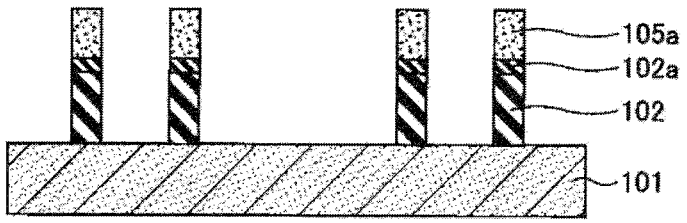

As illustrated in FIG. 4B, the base film 102 is etched using the first spacer material 105a formed into the first pattern as an etching mask. Accordingly, the base film 102 is formed into the first pattern. A dry etching such as, for example, a reactive ion etching (RIE) may be used as an etching method.

(First Spacer Material Removing Step)

Next, the first spacer material 105a is removed. For example, a dry etching or a wet etching may be used as a removal method.

(Substrate Patterning Step)

Next, the substrate 101 is etched using the base film 102 formed into the first pattern as an etching mask. A dry etching such as, for example, RIE may be used as an etching method.

By the above-mentioned steps, a semiconductor device having a desired fine pattern may be manufactured.

In the semiconductor device manufacturing method according to the first exemplary embodiment as described above, the steps from the base film forming step S1 to the first pattern forming step S5 may be performed by an atmospheric process. That is, the side wall may be formed without using a vacuum system processing (vacuum process), such as etch back, which is performed under vacuum. As a result, in the first exemplary embodiment as described above, a semiconductor device having a fine pattern by the SWT method may be easily manufactured without alternately repeating a vacuum process and an atmospheric process performed in the atmosphere.

Further, since the vacuum process and the atmospheric process are not repeated alternately, the number of times to move the substrate 101 between apparatuses may be reduced. Therefore, the time and cost required for manufacturing a semiconductor device having a desired fine pattern may be reduced, and the productivity may be improved.

As described above, according to the semiconductor device manufacturing method of the first exemplary embodiment, a semiconductor device having a desired fine pattern may be easily manufactured.

Next, a coating and developing apparatus as an exemplary semiconductor manufacturing apparatus which may be appropriately used for the semiconductor device manufacturing method of the present disclosure will be described with reference to FIGS. 5 to 7. The following descriptions will be made using a first block B1 as an example of a developing unit, a second block B2 as an example of an antireflective film forming unit, a third block B3 as an example of a photosensitive film forming unit, a fourth block B4 as an example of a case where a spacer material forming unit and a cleaning unit are one and the same unit, water-repellency treatment modules (ADH2, ADH3) as an example of a water-repellency treatment unit, a heating module as an example of a heating unit, and conveying arms A1, A2, A3, A4, a delivery unit C, a delivery arm D, a shuttle arm E, and an interface arm F as an example of a conveying mechanism which carries in and out substrates.

Figure 5:
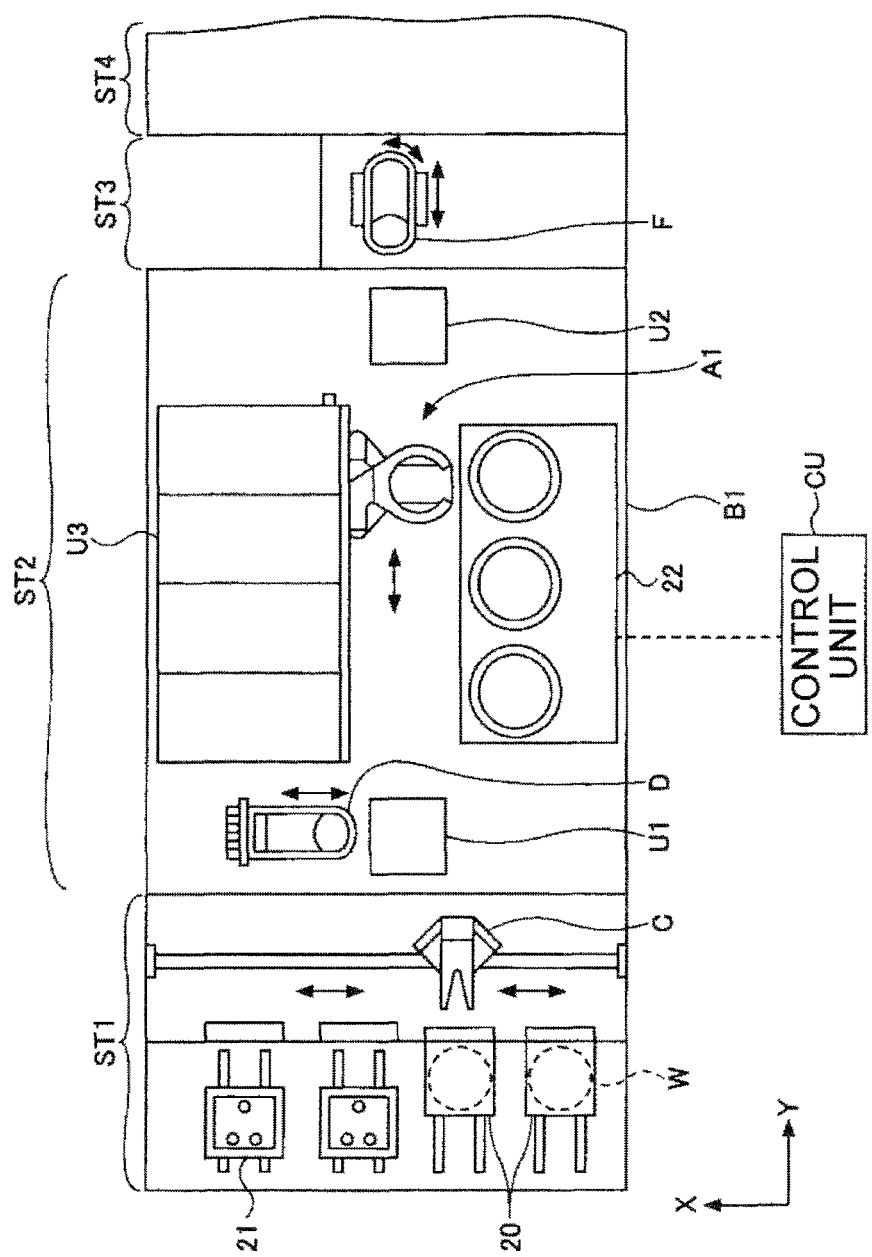
FIG. 5 is a plan view illustrating a schematic configuration of a coating and developing apparatus according to an exemplary embodiment.
Figure 6:
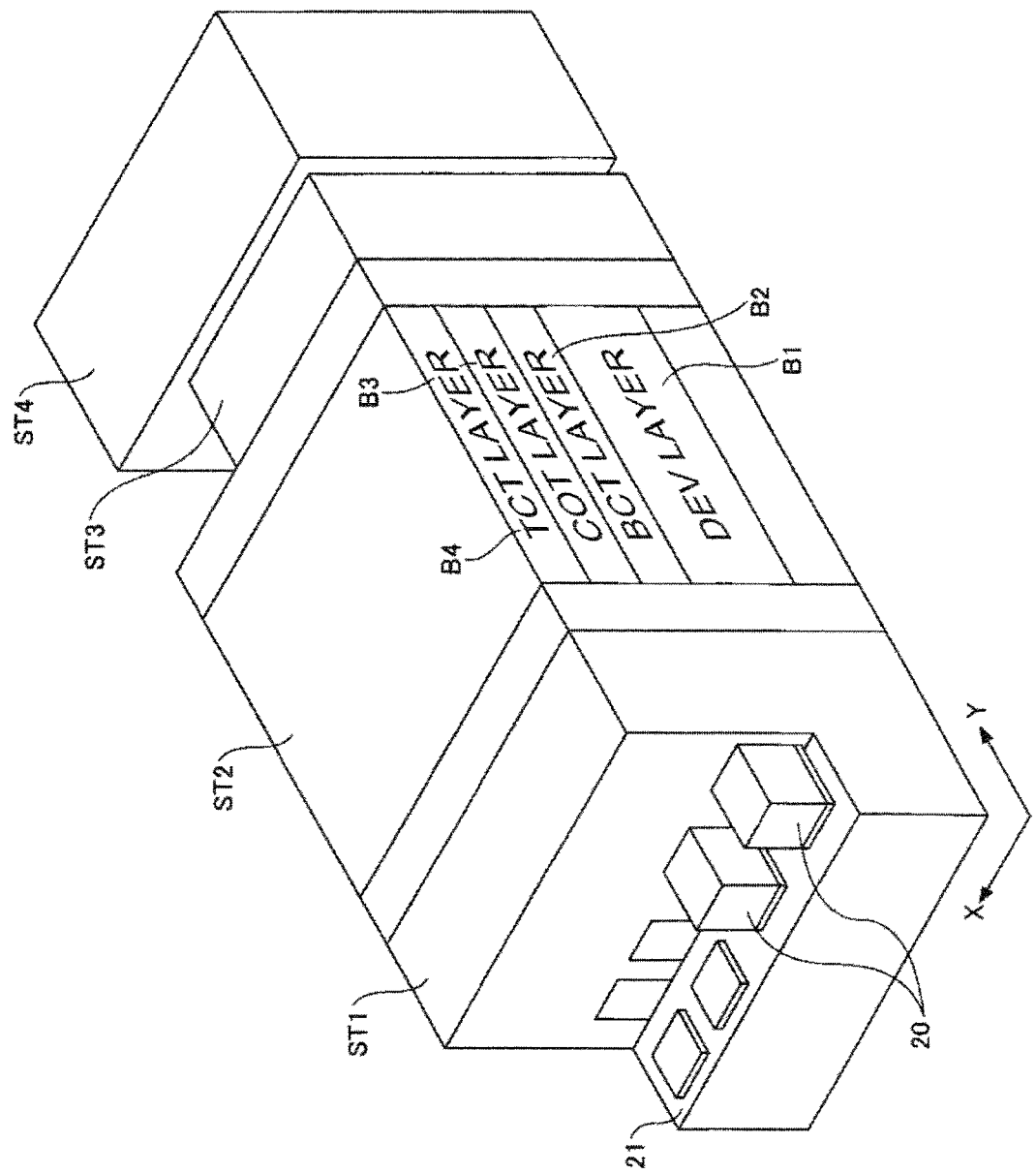
FIG. 6 is a perspective view illustrating a schematic configuration of the coating and developing apparatus of FIG. 5.
Figure 7:
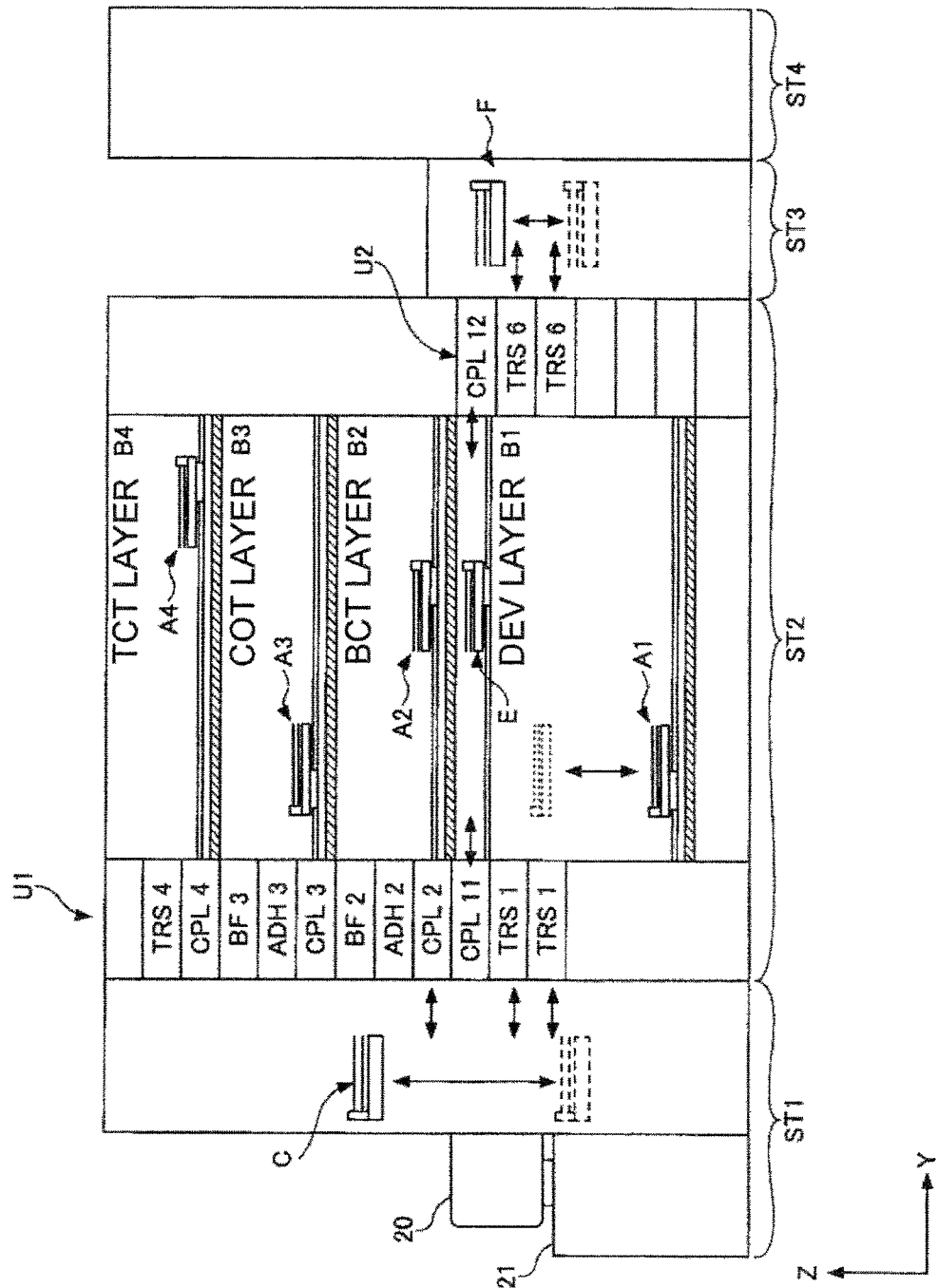
FIG. 7 is a side view illustrating a schematic configuration of the coating and developing apparatus of FIG. 5.

FIGS. 5, 6, and 7 illustrate a plan view, a perspective view, and a side view of an exemplary schematic structure of a coating and developing apparatus, respectively.

As illustrated in FIGS. 5 and 6, the coating and developing apparatus according to the first exemplary embodiment includes a carrier block ST1, a processing block ST2, and an interface block ST3. Further, an exposing device ST4 is provided at the interface block ST3 side of the coating and developing apparatus. The processing block ST2 is provided adjacent to the carrier block ST1. The interface block ST3 is provided adjacent to the processing block ST2 at a side of the processing block ST2 opposite to the carrier block ST1 side. The exposing device ST4 is provided adjacent to the interface block ST3 at a side of the interface block ST3 opposite to the processing block ST2 side.

An operation of the coating and developing apparatus according to the first exemplary embodiment is controlled by a control unit CU.

The carrier block ST1 includes a carrier 20, a placing table 21, and a delivery unit C. The carrier 20 is placed on the placing table 21. The delivery unit C removes a wafer W as an example of the substrate 101 from the carrier 20, and delivers (carries in) the wafer W to the processing block ST2. The delivery unit C receives the processed wafer W in the processing block ST2, and returns (carries out) the wafer W to the carrier 20.

As illustrated in FIGS. 5 and 6, the processing block ST2 includes a shelf unit U1, a shelf unit U2, a shelf unit U3, a first block (DEV layer) B1, a second block (a BCT layer) B2, a third block (COT layer) B3, and a fourth block (TCT layer) B4. In the first block B1, a development processing is performed. In the second block B2, an antireflective layer is formed as an example of the base film 102. In the third block B3, a photosensitizer is coated to form a photosensitive film 104. In the fourth block B4, a spacer material is supplied. In addition, in the fourth block B4, a cleaning liquid is supplied onto the spacer material.

The shelf unit U1 is configured by stacking various modules one on another. As illustrated in FIG. 7, the shelf unit U1 includes, for example, delivery modules TRS1, CPL11, CPL2, BF2, CPL3, and BF3. In addition, the shelf unit U1 includes, for example, water-repellency treatment modules ADH2, ADH3. Further, as illustrated in FIG. 5, a liftable delivery arm D is provided in the vicinity of the shelf unit U1. The wafer W is conveyed between modules of the shelf unit U1 by the delivery arm D.

The shelf unit U2 is configured by staking various modules one on another. As illustrated in FIG. 7, the shelf unit U2 includes delivery modules TRS6, TRS6, and CPL12 which are sequentially stacked from the bottom.

Meanwhile, in FIG. 7, a delivery module denoted by "CPL" also serves as a cooling module for adjusting a temperature and a delivery module denoted by "BF" also serves as a buffer module capable of placing a plurality of wafers W.

The shelf unit U3 is configured by staking various modules one on another. The shelf unit U3 includes a heating and cooling module which heats and cools the wafer W.

As illustrated in FIGS. 5 and 7, the first block B1 includes developing modules 22, a heating and cooling module provided in the shelf unit U3, a conveying arm A1, and a shuttle arm E. The developing modules 22 are stacked vertically in two tiers in one first block B1. The heating and cooling module performs a pre-processing (e.g., post-exposure baking) and a post-processing for a processing performed in the developing modules 22. The conveying arm A1 conveys the wafers W to the two-tiered developing modules 22. That is, the conveying arm A1 is shared by the two-tiered developing modules 22, as a conveying arm which conveys the wafers W. The shuttle arm E directly conveys the wafers W from the delivery module CPL11 of the shelf unit U1 to the delivery module CPL12 of the shelf unit U2.

Each of the second block B2, the third block B3, and the fourth block B4 includes a coating module, the heating and cooling module provided in the shelf unit U3, and the conveying arms A2, A3, A4. The coating module supplies a chemical liquid to rotating wafers W, thereby performing a spin-coating. The heating and cooling module performs a pre-processing and a post-processing for a liquid processing performed in the coating module. The conveying arms A2, A3, A4 are provided between the coating module and the processing module group and deliver the wafers W between the coating module and each processing module of the processing module group.

Each coating module provided in each block from the second block B2 to the fourth block B4 has the same configuration, except that chemical liquids to be supplied are different. That is, the chemical liquid supplied by the coating module of the second block B2 is a chemical liquid for the antireflective film, the chemical liquid supplied by the coating module of the third block B3 is a photosensitizer, and the chemical liquids supplied by the coating module of the fourth module B4 are a spacer material and an organic solvent.

As illustrated in FIG. 5, the interface block ST3 has an interface arm F. The interface arm F is provided in the vicinity of the shelf unit U2 of the processing block ST2. The wafers W are conveyed by the interface arm F between the processing modules of the shelf unit U2 and between the shelf unit U2 and the exposing device ST4.

Next, an exemplary operation of the coating and developing apparatus will be described. Meanwhile, the following operations are controlled by a control unit CU.

First, the wafers W are sequentially conveyed from the carrier block ST1 to one delivery module of the shelf unit U1, for example, the delivery module CPL2 corresponding to the second module B2 by the delivery unit C. The wafers W conveyed to the delivery module CPL2 are delivered to the conveying arm A2 of the second block B2, and conveyed to the coating module or the processing modules of the second block B2 through the conveying arm A2 so that the corresponding processings are performed in the individual modules. Accordingly, the antireflective film is formed on the wafers W. The wafers W coated with the antireflective film are conveyed to the water-repellency treatment module ADH2 of the shelf unit U1 through the conveying arm A2 so that the water-repellency treatment is performed on the surface of the antireflective film (base film forming step S1).

The wafers W coated with the antireflective layer having a water-repellent surface are delivered to the conveying arm A3 of the third block B3 through the conveying arm A2, the delivery module BF2 of the shelf unit U1, the delivery arm D, and the delivery module CPL3 of the shelf unit U1. The wafers W are conveyed to the coating module or the processing modules of the third block B3 through the conveying arm A3 so that the corresponding processings are performed in the individual modules. Accordingly, the photosensitive film 104 is formed on the wafers W. The wafers W coated with the photosensitive film 104 are conveyed to the water-repellency treatment module ADH3 of the shelf unit U1 so that the water-repellency treatment is performed on the surface of the photosensitive film (photosensitive film forming step S2).

The wafers W coated with the photosensitive film 104 having a water-repellent surface are delivered to the shuttle arm E of the first block B1 through the conveying arm A3, the delivery module BF3 of the shelf unit U1, the delivery arm D, and the delivery module CPL11 of the shelf unit U1. The wafers W are conveyed directly to the delivery module CPL12 of the shelf unit U2 by the shuttle arm E, and then, delivered to the interface arm F of the interface block ST3. The wafers W delivered to the interface arm F are conveyed to the exposing device ST4 so that a predetermined exposure processing is performed.

The wafers W subjected to the predetermined exposure processing are placed in the delivery module TRS6 of the shelf unit U2 through the interface arm F and returned to the processing block ST2. The wafers W returned to the processing block ST2 are subjected to a development processing in the developing modules 22 of the first block B1 (photosensitive film pattern forming step S3).

The wafers W subjected to the development processing are delivered to the conveying arm A4 of the fourth block B4 through the conveying arm A1, the delivery module TRS1 of the shelf unit U1, the delivery arm D, and the delivery module CPL4 of the shelf unit U1. The wafers W are conveyed to the coating module or the processing modules of the fourth block B4 through the conveying arm A4 so that the corresponding processings are performed in the individual modules. Accordingly, the first spacer material 105 is formed on the photosensitive film 104 and the exposed antireflective film (first spacer material forming step S4).

The wafers W coated with the first spacer material 105 are conveyed to the respective processing modules of the shelf unit U2 through the conveying arm A4 and cleaned by supplying an organic solvent (first pattern forming step S5).

The wafers W supplied with the organic solvent are returned to the carrier 20 through the conveying arm A4, the delivery module TRS4 of the shelf unit U1, and the delivery unit C.

The wafers W returned to the carrier 20 are conveyed from the coating and developing apparatus to the outside by a conveying unit (not illustrated) and the antireflective film is etched in a desired pattern with the first spacer material 105a as an etching mask by an etching device such as an RIE device to have a desired pattern.

Then, the wafers W having a desired pattern obtained by etching the antireflective film are conveyed from the etching device to a first spacer material removing device by a conveying unit (not illustrated) to remove the first spacer material 105a.

Finally, the wafers W from which the first spacer material has been removed are conveyed to the etching device by a conveying unit (not illustrated) and etched with the antireflective film having a desired pattern as an etching mask to have a desired pattern.

As described above, according to the semiconductor device manufacturing method of the first exemplary embodiment, the steps from the base film forming step S1 to the first pattern forming step S5 may be performed by the same coating and developing apparatus so that the process may be simplified. Therefore, a semiconductor device having a desired fine pattern may be easily manufactured.

[Second Exemplary Embodiment]

Next, an exemplary semiconductor device manufacturing method according to a second exemplary embodiment of the present disclosure will be described with reference to FIGS. 8A to 8D and 9A to 9D. FIGS. 8A to 8D and 9A to 9D are cross-sectional views illustrating steps of an exemplary semiconductor device manufacturing method according to a second exemplary embodiment.

The second exemplary embodiment is different from the first exemplary embodiment in that the water-repellent layer 102a is formed on the surface of the base film 102 at the same time as the formation of the base film 102 by spin-coating a coating liquid for base film formation containing a water-repellent material.

Further, the second exemplary embodiment is different from the first exemplary embodiment in that the water-repellent layer 104a is formed on the surface of the photosensitive film 104 at the same time as the formation of the photosensitive film 104 by spin-coating a coating liquid for photosensitive film formation containing a water-repellent material.

Other than the above-mentioned differences, the second exemplary embodiment is the same as the first exemplary embodiment. Therefore, descriptions thereof will be focused on the differences.

(Base Film Forming Step S1)

Figure 8A:
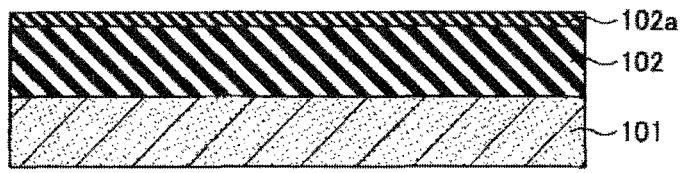
FIGS. 8A to 8D are cross-sectional views illustrating steps of an exemplary semiconductor device manufacturing method according to a second exemplary embodiment.

In the semiconductor device manufacturing method according to the second exemplary embodiment, as illustrated in FIG. 8A, a water-repellent layer 102a is formed on a surface of a base film 102 by spin-coating a coating liquid containing a water-repellent material on a substrate 101.

As the base film 102, an antireflective film such as, for example, SiARC, BARC, SOC, or amorphous carbon, may be used. Among them, BARC is preferably used from the viewpoint that the water-repellent material is easily deposited on the surface of the base film 102.

As the water-repellent material, a surfactant containing a fluoroalkyl group, or a silane coupling agent, for example, may be suitably used.

(Photosensitive Film Forming Step S2)

Figure 8B:
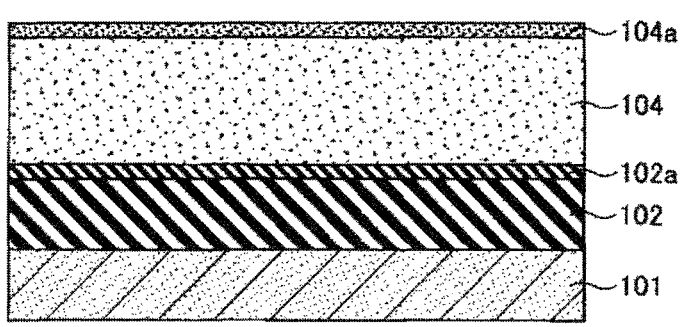

As illustrated in FIG. 8B, a water-repellent layer 104a is formed on a surface of a photosensitive film 104 by spin-coating a coating liquid containing a water-repellent material on the base film 102.

As the water-repellent material, a surfactant containing a fluoroalkyl group, or a silane coupling agent, for example, may be suitably used.

(Photosensitive Film Forming Step S3 to Substrate Patterning Step)

Patterning of the substrate is performed in the same manner as in the first exemplary embodiment.

Figure 8C:
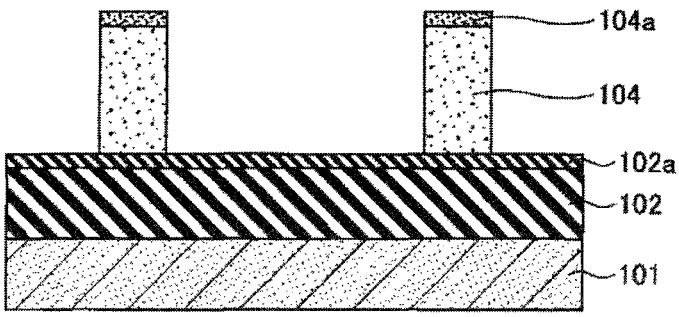

That is, as illustrated in FIG. 8C, a photosensitive film pattern is formed by performing an exposure processing and a development processing on the photosensitive film 104 (photosensitive film pattern forming step S3).

Figure 8D:
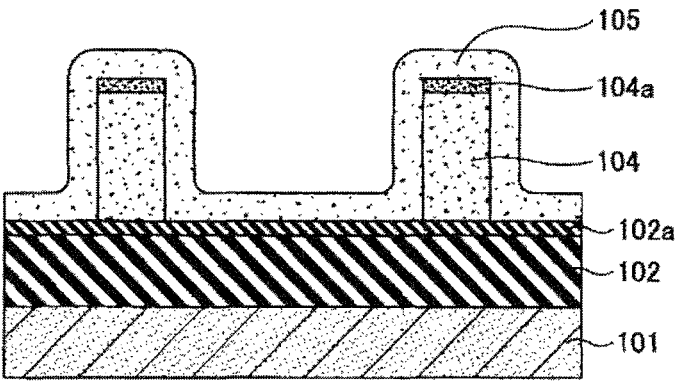
Figure 9A:
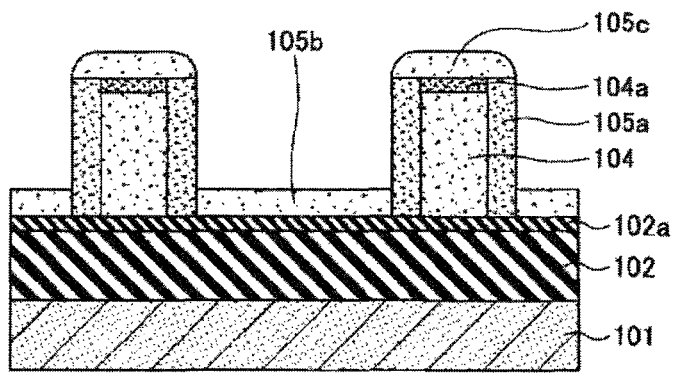
FIGS. 9A to 9D are cross-sectional views illustrating steps of the exemplary semiconductor device manufacturing method according to the second exemplary embodiment.
Figure 9B:
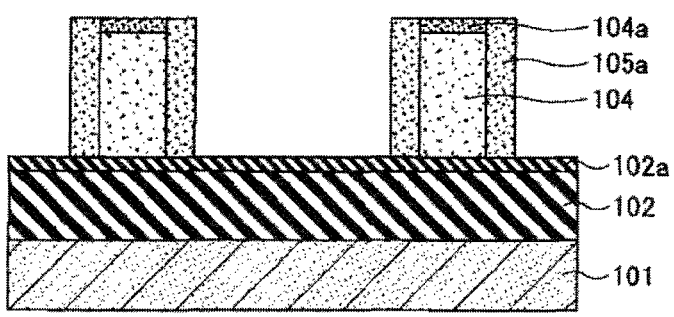
Figure 9C:
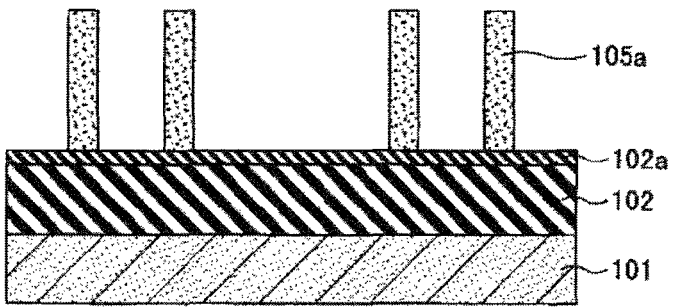
Figure 9D:
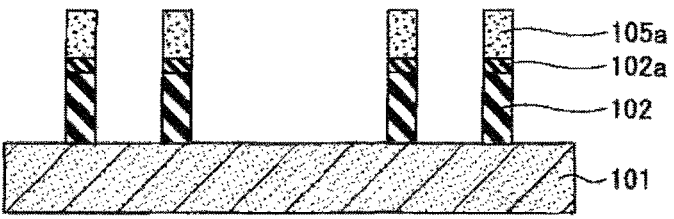

As illustrated in FIG. 8D, a spacer material 105 is supplied onto the photosensitive film 104 and the exposed base film 102. Next, as illustrated in FIG. 9A, the substrate 101 supplied with the first spacer material 105 is dried (first spacer material forming step S4). Next, as illustrated in FIG. 9B, the substrate 101 is cleaned with an organic solvent (first pattern forming step S5). Next, as illustrated in FIG. 9C, the photosensitive film 104 is etched by a dry etching method or a wet etching method (photosensitive film removing step). Next, as illustrated in FIG. 9D, the base film 102 is etched by using a first spacer material 105a as an etching mask. After the first spacer material 105a is removed, the substrate 101 is etched using the base film 102 formed into the first pattern as an etching mask.

By the above-mentioned steps, a semiconductor devise having a desired fine pattern may be manufactured.

As described above, according to the semiconductor device manufacturing method of the second exemplary embodiment, a semiconductor device having a desired fine pattern may be easily manufactured.

Particularly, in the semiconductor device manufacturing method according to the second exemplary embodiment, the base film 102 is formed by spin-coating a coating liquid containing a water-repellent material so that a water-repellency is imparted to the surface of the base film 102 (a water-repellent layer 102a is formed). Therefore, since the water-repellent material is supplied to the surface of the base film 102 after the base film 102 is formed, it is not necessary to form a water-repellent layer 102a.

Further, in the semiconductor device manufacturing method according to the second exemplary embodiment, the photosensitive film 104 is formed by spin-coating a coating liquid containing the water-repellent material so that the water-repellency is imparted to the surface of the photosensitive film 104 (a water-repellent layer 104a is formed). Therefore, since the water-repellent material is supplied to the surface of the photosensitive film 104 after the photosensitive film 104 is formed, it is not necessary to form a water-repellent layer 104a.

Accordingly, the number of steps in the semiconductor device manufacturing method may be reduced. As a result, manufacturing costs may be reduced.

Further, the coating and developing apparatus according to the first exemplary embodiment may also be suitably used in the semiconductor device manufacturing method according to the second exemplary embodiment, and the steps from the base film forming step S1 to the first pattern forming step S5 may be performed by the same coating and developing apparatus so that the process may be simplified. Therefore, a semiconductor device having a desired fine pattern may be easily manufactured.

[Third Exemplary Embodiment]

Next, an exemplary semiconductor device manufacturing method according to a third exemplary embodiment of the present disclosure will be described with reference to FIGS. 10A to 10D, 11A to 11D, 12A to 12D, and 13. FIGS. 10A to 10D, 11A to 11D, 12A to 12D, and 13 are cross-sectional views illustrating steps of an exemplary semiconductor device manufacturing method according to a third exemplary embodiment.

The third exemplary embodiment is different from the first exemplary embodiment in that a second spacer material forming step of supplying a second spacer material 106 onto the substrate 101 and a second pattern forming step of removing at least a part of the second spacer material formed on the top surface of the photosensitive film 104 and the top surface of the base film 102 to form a second pattern by the second spacer material 106, are included after the first pattern forming step S5.

Other than the above-mentioned difference, the third exemplary embodiment is the same as the first exemplary embodiment. Therefore, descriptions thereof will be focused on the difference.

(Base Film Forming Step S1 to First Pattern Forming Step S5)

In the semiconductor device manufacturing method according to the third exemplary embodiment, a first pattern is formed in the same manner as in the first exemplary embodiment.

Figure 10A:
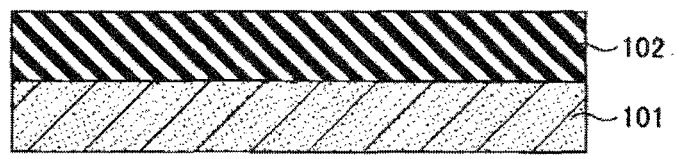
FIGS. 10A to 10D are cross-sectional views illustrating steps of an exemplary semiconductor device manufacturing method according to a third exemplary embodiment.
Figure 10B:
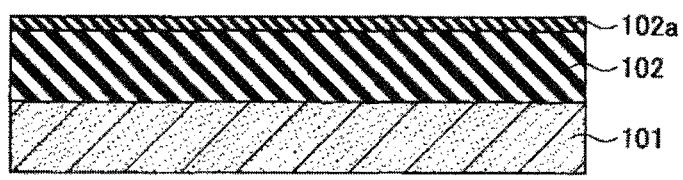
Figure 10C:
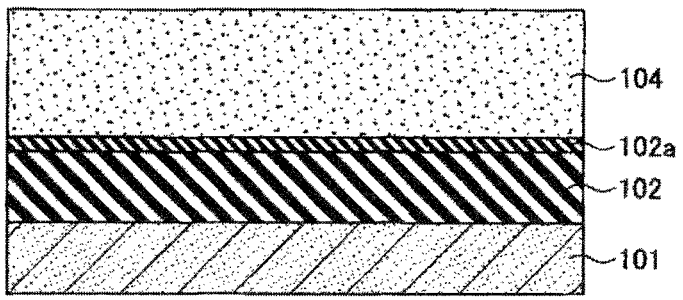
Figure 10D:
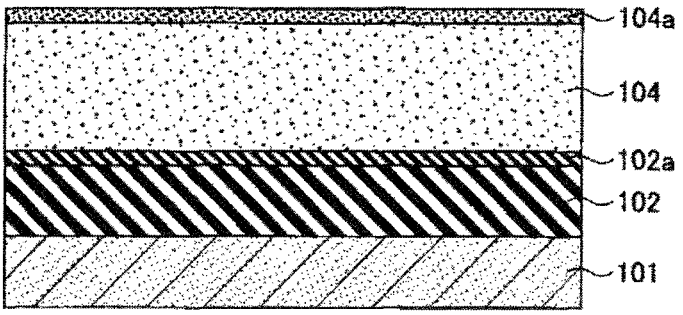

That is, a water-repellent layer 102a is formed by forming a base film 102 on a substrate 101 as illustrated in FIG. 10A, and then, performing a water-repellency treatment on the surface of the base film 102 as illustrated in FIG. 10B (base film forming step S1). Next, a water-repellent layer 104a is formed by forming a photosensitive film 104 on the water-repellent layer 102a as illustrated in FIG. 10C, and then, performing a water-repellency treatment on the surface of the photosensitive film 104 as illustrated in FIG. 10D (photosensitive film forming step S2).

Figure 11A:
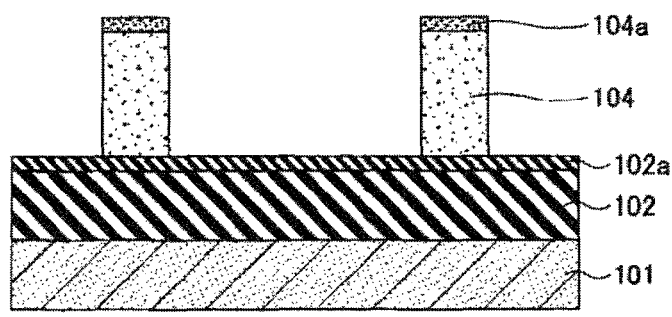
FIGS. 11A to 11D are cross-sectional views illustrating steps of the exemplary semiconductor device manufacturing method according to the third exemplary embodiment.
Figure 11B:
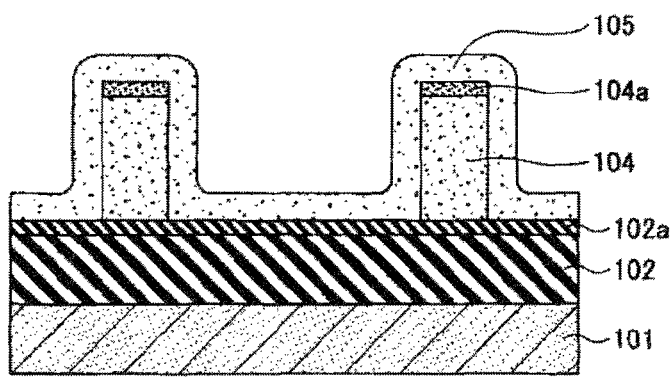
Figure 11C:
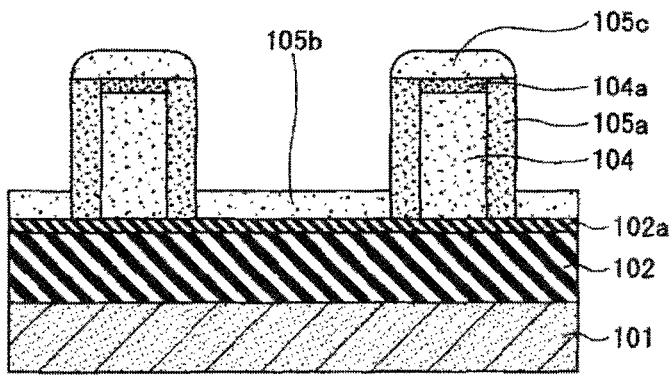
Figure 11D:
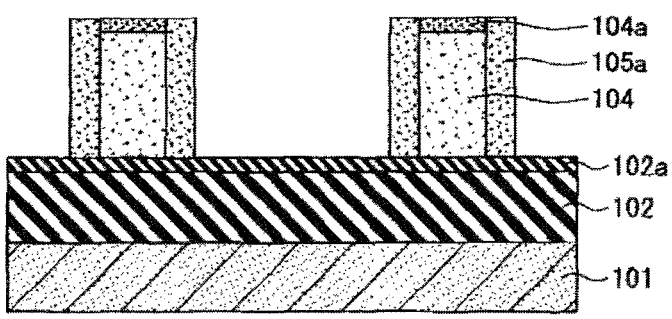

Next, as illustrated in FIG. 11A, a photosensitive film pattern is formed by performing an exposure processing and a development processing on the photosensitive film 104 (photosensitive film pattern forming step S3). Next, as illustrated in FIG. 11B, a first spacer material 105 is supplied onto the photosensitive film 104 and the exposed base film 102. Next, as illustrated in FIG. 11C, the substrate 101 supplied with the first spacer material 105 is dried (first spacer material forming step S4). Next, as illustrated in FIG. 11D, the substrate 101 is cleaned with an organic solvent (first pattern forming step S5).

(Second Spacer Material Forming Step)

Figure 12A:
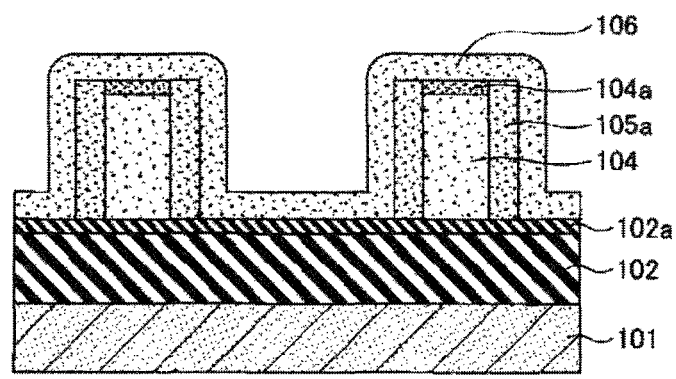
FIGS. 12A to 12D are cross-sectional views illustrating steps of the exemplary semiconductor device manufacturing method according to the third exemplary embodiment.

As illustrated in FIG. 12A, a second spacer material 106 is supplied onto the substrate 101.

As a material of the second spacer material 106, a material having a different etching rate (high etching resistance) from that of the material of the first spacer material 105 may be used. For example, an organometallic compound or silane coupling agent containing a metal different from that of the material of the first spacer material 105 may be suitably used. Therefore, in a second pattern forming step (to be described later), only the first spacer material 105 may be efficiently etched by using the difference in etching rate between the first spacer material 105 and the second spacer material 106.

Figure 12B:
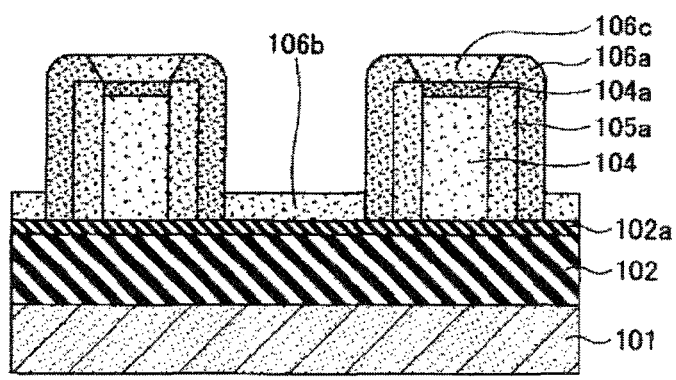

The second spacer material 106 may be formed in the same manner as the first spacer material 105. As illustrated in FIG. 12B, the substrate 101 supplied with the second spacer material 106 is dried. At this time, a second spacer material 106b formed on the top surface of the base film 102, which has the water-repellent layer 102a, hardly reacts with the base film 102 and does not undergo solidification. Further, a second spacer material 106c formed on the top surface of the photosensitive film 104, which has the water-repellent layer 104a, hardly reacts with the photosensitive film 104 and does not undergo solidification. Meanwhile, a second spacer material 106a formed on the side wall of the first spacer material 105a, which does not have the water-repellent layer 102a and the water-repellent layer 104a, reacts with the first spacer material 105a and undergoes solidification.

A method of drying the substrate 101 is not particularly limited. However, from the viewpoint of facilitating solidification of the second spacer material 106a formed on the side wall of the first spacer material 105a and stabilizing it, the method preferably includes a heating step of performing a heating processing. The temperature of the heating processing may be below a heat-resistant temperature of the photosensitive film 104, for example, 100° C. to 150° C.

(Second Pattern Forming Step)

Figure 12C:
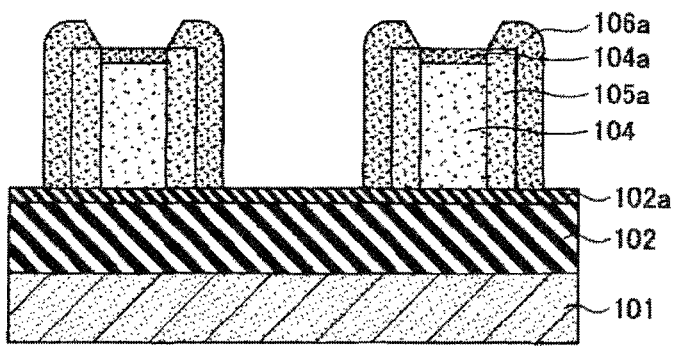

As illustrated in FIG. 12C, the substrate 101 is cleaned with an organic solvent. Accordingly, in the second spacer material 106, a portion which does not undergo solidification is removed, and a solidified portion is not removed but remains. That is, the second spacer material 106b formed on the top surface of the water-repellent layer 102a and the second spacer material 106c formed on the top surface of the water-repellent layer 104a are removed. On the other hand, the second spacer material 106a formed on the side wall of the first spacer material 105a is substantially not removed but remains. Thus, a second pattern is formed by the second spacer material 106a formed on the side wall of the first spacer material 105a.

(First Spacer Material Removing Step)

Figure 12D:
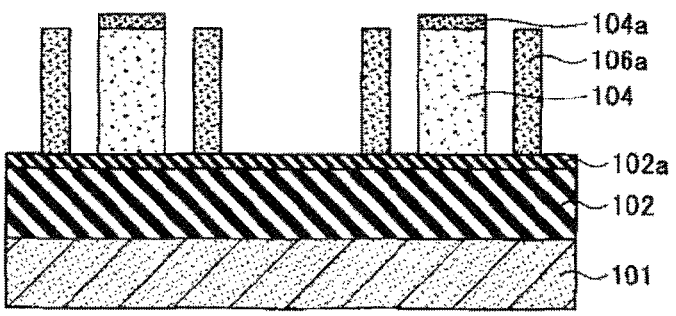

As illustrated in FIG. 12D, the first space material 105a is etched by a dry etching method or a wet etching method. Accordingly, the first space material 105a is selectively etched and removed.

Meanwhile, the removal of the first spacer material 105a may be performed simultaneously with the removal of the second spacer material 106b and the second spacer material 106c in the second pattern forming step. The method of performing the removal of the first spacer material 105a simultaneously with the removal of the second spacer material 106b and the second spacer material 106c may be exemplified with a method of performing a spin-on processing with an aqueous hydrofluoric acid solution.

At this time, the photosensitive film pattern formed by the photosensitive film 104 and the second pattern formed by the second spacer material 106a are formed on the base film 102.

(Base Film Etching Step)

Figure 13:
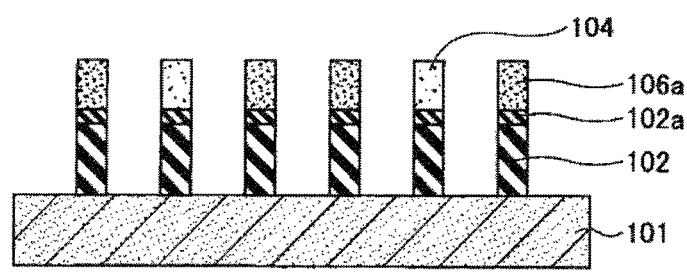
FIG. 13 is a cross-sectional view illustrating a step of the exemplary semiconductor device manufacturing method according to the third exemplary embodiment.

As illustrated in FIG. 13, the base film 102 is etched using the photosensitive film 104 formed into the photosensitive film pattern the second spacer material 106a formed into the second pattern as etching masks. A dry etching such as, for example, RIE may be used as an etching method.

(Photosensitive Film and Second Spacer Material Removing Step)

Next, the photosensitive film 104 and the second spacer material 106a are removed. For example, a dry etching or a wet etching may be used as a removal method.

(Substrate Patterning Step)

Next, the substrate 101 is etched using the base film 102 formed into a desired pattern as an etching mask. A dry etching such as, for example, RIE may be used as an etching method.

By the above-mentioned steps, a semiconductor devise having a desired fine pattern may be manufactured.

As described above, according to the semiconductor device manufacturing method of the third exemplary embodiment, a semiconductor device having a desired fine pattern may be easily manufactured.

Particularly, in the semiconductor device manufacturing method according to the third exemplary embodiment, a desired pattern is formed by the photosensitive film 104 formed into the photosensitive film pattern and the second spacer material 106a formed into the second pattern. Therefore, the pitch of the second pattern may be below a resolution limit or smaller of an exposure device or smaller than the pitch of the first pattern.

Further, the coating and developing apparatus according to the first exemplary embodiment may also be suitably used in the semiconductor device manufacturing method according to the third exemplary embodiment, and the steps from the base film forming step to the second pattern forming step may be performed by the same coating and developing apparatus so that the process may be simplified. Therefore, a semiconductor device having a desired fine pattern may be easily manufactured.

[Fourth Exemplary Embodiment]

Next, an exemplary semiconductor device manufacturing method according to a fourth exemplary embodiment of the present disclosure will be described with reference to FIGS. 14A to 14D, 15A to 15D, 16A to 16D, and 17. FIGS. 14A to 14D, 15A to 15D, 16A to 16D, and 17 are cross-sectional views illustrating steps of an exemplary semiconductor device manufacturing method according to a fourth exemplary embodiment.

The fourth exemplary embodiment is different from the first exemplary embodiment in that a photosensitive film pattern removing step of removing the photosensitive film pattern, a second spacer material forming step of supplying a second spacer material 106 onto the substrate 101 and a second pattern forming step of etching the second spacer material 106 such that the first spacer material 105 is exposed, are included after the first pattern forming step S5.

Other than the above-mentioned difference, the fourth exemplary embodiment is the same as the first exemplary embodiment. Therefore, descriptions thereof will be focused on the difference.

(Base Film Forming Step S1 to First Pattern Forming Step S5)

In the semiconductor device manufacturing method according to the fourth exemplary embodiment, a first pattern is formed in the same manner as in the first exemplary embodiment.

Figure 14A:
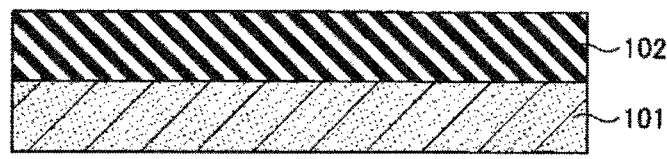
FIGS. 14A to 14D are cross-sectional views illustrating steps of an exemplary semiconductor device manufacturing method according to a fourth exemplary embodiment.
Figure 14B:
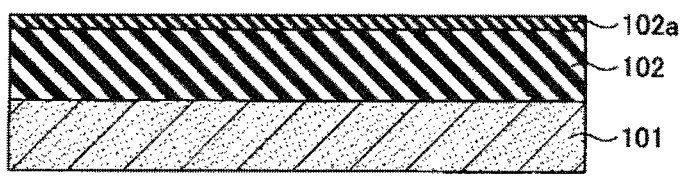
Figure 14C:
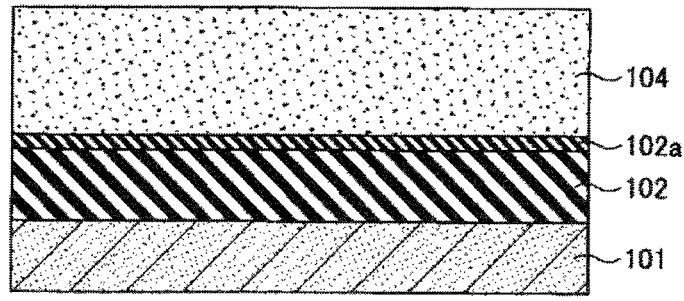
Figure 14D:
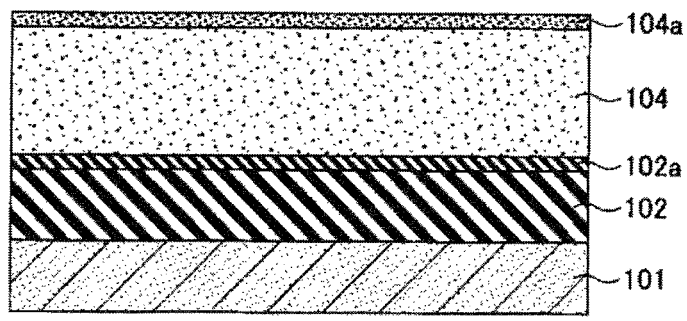

That is, a water-repellent film 102a is formed by forming a base film 102 on a substrate 101 as illustrated in FIG. 14A, and then, performing a water-repellency treatment on the surface of the base film 102 as illustrated in FIG. 14B (base film forming step S1). Next, a water-repellent layer 104a is formed by forming a photosensitive film 104 on the water-repellent layer 102a as illustrated in FIG. 14C, and then, performing a water-repellency treatment on the surface of the photosensitive film 104 as illustrated in FIG. 14D (photosensitive film forming step S2).

Figure 15A:
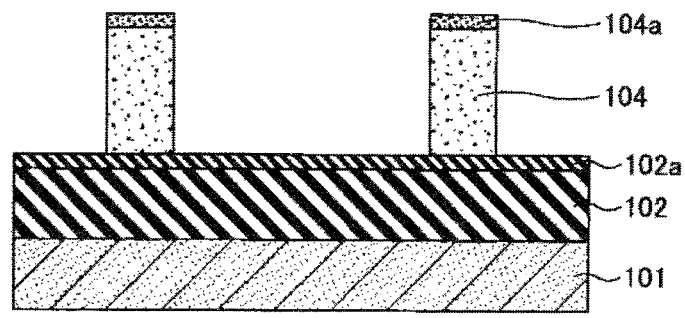
FIGS. 15A to 15D are cross-sectional views illustrating steps of the exemplary semiconductor device manufacturing method according to the fourth exemplary embodiment.
Figure 15B:
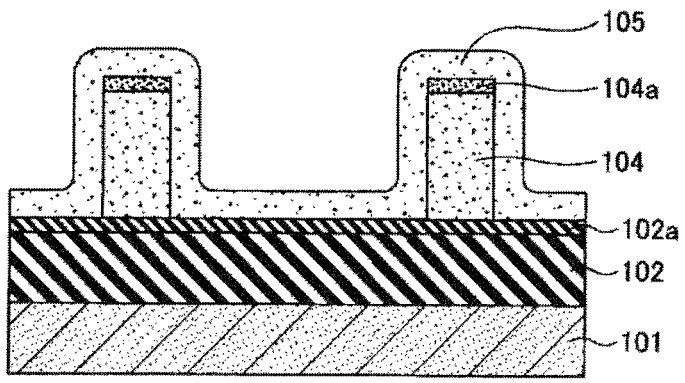
Figure 15C:
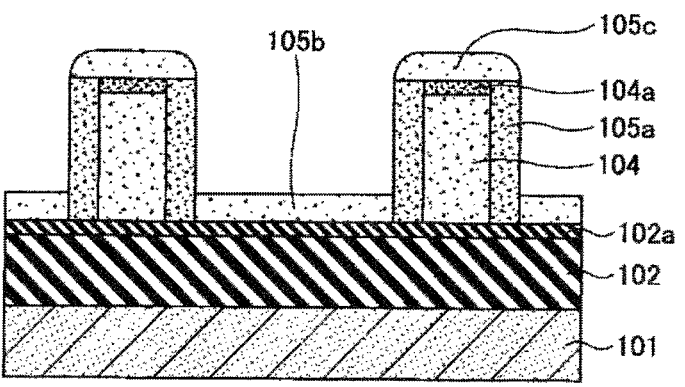
Figure 15D:
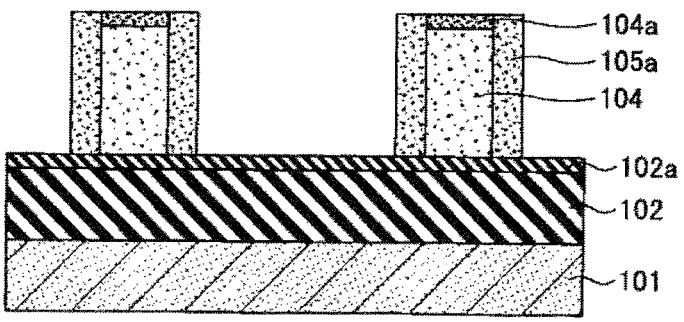

Next, as illustrated in FIG. 15A, a photosensitive film pattern is formed by performing an exposure processing and a development processing on the photosensitive film 104 (photosensitive film pattern forming step S3). Next, as illustrated in FIG. 15B, a first spacer material 105 is supplied onto the photosensitive film 104 and the exposed base film 102. Next, as illustrated in FIG. 15C, the substrate 101 supplied with the first spacer material 105 is dried (first spacer material forming step S4). Next, as illustrated in FIG. 15D, the substrate 101 is cleaned with an organic solvent (first pattern forming step S5).

(Photosensitive Film Removing Step)

Figure 16A:
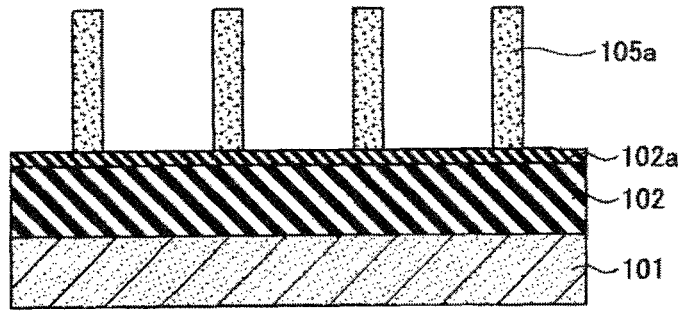
FIGS. 16A to 16D are cross-sectional views illustrating steps of the exemplary semiconductor device manufacturing method according to the fourth exemplary embodiment.

As illustrated in FIG. 16A, the photosensitive film 104 is removed. For example, a dry etching or a wet etching may be used as a removal method.

(Second Spacer Material Forming Step)

Figure 16B:
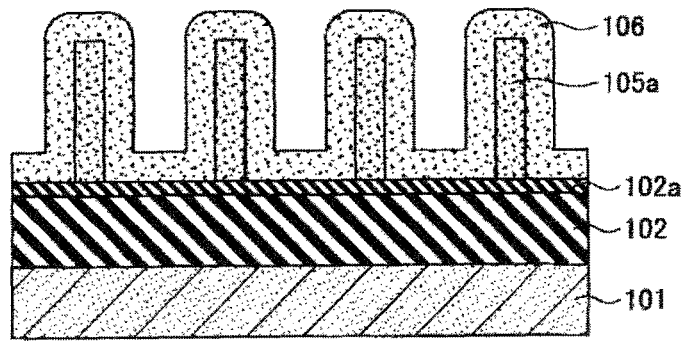

As illustrated in FIG. 16B, a second spacer material 106 is supplied onto the substrate 101.

As a material of the second spacer material 106, a material having a different etching rate from that of the material of the first spacer material 105 may be used. For example, an organometallic compound or silane coupling agent containing a metal different from that of the material of the first spacer material 105 may be suitably used. Therefore, in a second pattern forming step (to be described later), only the first spacer material 105 may be efficiently etched by using the difference in etching rate between the first spacer material 105 and the second spacer material 106.

The second spacer material 106 may be formed in the same manner as the first spacer material 105.

(Second Pattern Forming Step)

Figure 16C:
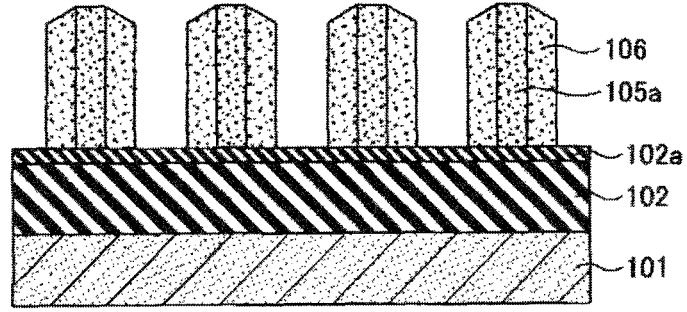

As illustrated in FIG. 16C, a second pattern is formed by the second spacer material 106 by etching back the second spacer material 106 such that the first spacer material 105 is exposed. For example, a dry etching or a wet etching may be used as an etching-back method.

(First Spacer Material Removing Step)

Figure 16D:
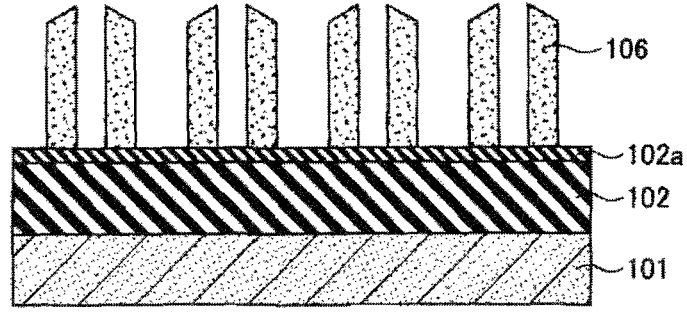

As illustrated in FIG. 16D, the first space material 105a formed into the first pattern is etched by a dry etching method or a wet etching method. Accordingly, the first space material 105a is selectively etched and removed.

At this time, the second pattern is formed by the second spacer material 106 on the base film 102.

(Base Film Etching Step)

Figure 17:
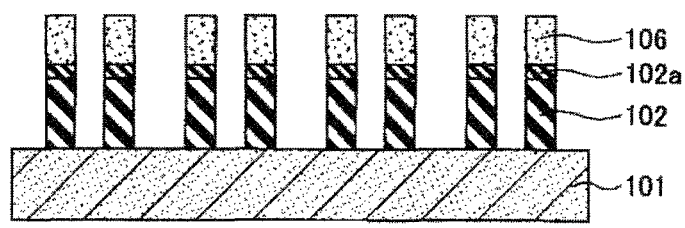
FIG. 17 is a cross-sectional view illustrating a step of the exemplary semiconductor device manufacturing method according to the fourth exemplary embodiment.

As illustrated in FIG. 17, the base film 102 is etched using the second spacer material 106 formed into the second pattern as etching masks. A dry etching such as, for example, RIE may be used as an etching method.

(Second Spacer Material Removing Step)

Next, the second spacer material 106 is removed. For example, a dry etching or a wet etching may be used as a removal method.

(Substrate Patterning Step)

Next, the substrate 101 is etched using the base film 102 formed into the second pattern as an etching mask. A dry etching such as, for example, RIE may be used as an etching method.

By the above-mentioned steps, a semiconductor devise having a desired fine pattern may be manufactured.

As described above, according to the semiconductor device manufacturing method of the fourth exemplary embodiment, a semiconductor device having a desired fine pattern may be easily manufactured.

Particularly, in the semiconductor device manufacturing method according to the fourth exemplary embodiment, the second spacer material 106 formed into the second pattern is formed at both sides of the side wall of each patterned first spacer material 105a. Therefore, a pitch of the second pattern may be below a resolution limit or smaller of an exposure device or smaller than the pitch of the first pattern.

Further, the coating and developing apparatus according to the first exemplary embodiment may also be suitably used in the semiconductor device manufacturing method according to the fourth exemplary embodiment, and the steps from the base film forming step S1 to the first pattern forming step S5 may be performed by the same coating and developing apparatus so that the process may be simplified. Therefore, a semiconductor device having a desired fine pattern may be easily manufactured.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method of manufacturing a semiconductor device, the method comprising:
    forming a base film on a substrate, wherein a top of the base film includes a water-repellent surface;
    forming a photosensitive film on the base film, wherein a top of the photosensitive film includes a water-repellent surface;
    developing the photosensitive film to expose the water-repellent surface of the base film, thereby forming a photosensitive film pattern, wherein when viewed in a vertical cross section, the photosensitive film pattern includes the water-repellent surface on the top of the photosensitive film, and when viewed in a vertical cross section, the photosensitive film pattern further includes plural side portions of the photosensitive film that have no water-repellent surface;
    applying a first spacer material to the water-repellent surface on the top of the photosensitive film, the plural side portions of the photosensitive film, and the exposed base film;
    drying the substrate on which the first spacer material is applied to the water-repellent surface on the top of the photosensitive film, the plural side portions of the photosensitive film, and the exposed based film such that the first spacer material applied to the plural side portions of the photosensitive film that have no water-repellent surface chemically reacts with the photosensitive film to be solidified, while the first spacer material applied to the water-repellent surface on the top of the photosensitive film hardly reacts chemically with the photosensitive film and does not undergo solidification; and with the first spacer material applied to the water-repellent surface on the top of the photosensitive film, the plural side portions of the photosensitive film, and the exposed base film, removing at least a part of the first spacer material from the water-repellent surface on the top of the photosensitive film and the exposed base film by cleaning the substrate with an organic solvent while, in the removing, leaving the first spacer material solidified on the plural side portions of the photosensitive film when viewed in a vertical cross section, thereby forming a first pattern having a pitch smaller than that of the photosensitive film pattern.

2. The method of claim 1, wherein the base film includes an antireflective film, and the forming of the base film includes applying a water-repellent material on a surface of the base film in order to form the water-repellent surface of the base film after the base film is formed.

3. The method of claim 2, wherein spin-coating is used in the forming of the base film before the applying the water-repellent material on the surface of the base film.

4. The method of claim 1, wherein the forming of the photosensitive film includes applying a water-repellent material on the photosensitive film after the photosensitive film is formed.

5. The method of claim 1, wherein the forming of the photosensitive film includes spin-coating a coating liquid containing a water-repellent material to form the photosensitive film.

6. The method of claim 1, wherein the drying of the substrate includes heating the substrate on which the first spacer material is applied to the water-repellent surface on the top of the photosensitive film, the plural side portions of the photosensitive film, and the exposed base film.

7. The method of claim 1, further comprising, after the removing of at least a part of the first spacer material, applying a second spacer material onto the substrate; and removing at least a part of the second spacer material formed on the top surface of the photosensitive film and the top surface of the base film in order to form a second pattern.

8. The method of claim 1, further comprising, after the removing of at least a part of the first spacer material, removing the photosensitive film pattern;

applying a second spacer material onto the substrate; and etching back the second spacer material such that the first spacer material is exposed.

9. The method of claim 7, further comprising, after the removing of at least a part of the second spacer material, removing the first spacer material.

* * * * *